(12) United States Patent
Gou et al.

(10) Patent No.: US 9,667,899 B2
(45) Date of Patent: May 30, 2017

(54) ANALOG-DIGITAL CONVERTING DEVICE AND METHOD HAVING A SUCCESSIVE APPROXIMATION REGISTER ANALOG-DIGITAL CONVERTING CIRCUIT AND A SINGLE-SLOP ANALOG-DIGITAL CONVERTING CIRCUIT, AND IMAGE SENSOR INCLUDING THE SAME

(71) Applicants: SK hynix Inc., Icheon (KR); INDUSTRY-UNIVERSITY COOPERATION FOUNDATION HANYANG UNIVERSITY, Seoul (KR)

(72) Inventors: Ja-Seung Gou, Icheon (KR); Oh-Kyong Kwon, Seoul (KR); Min-Kyu Kim, Seoul (KR)

(73) Assignees: SK HYNIX INC., Icheon (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 281 days.

(21) Appl. No.: 14/543,835

(22) Filed: Nov. 17, 2014

(65) Prior Publication Data
US 2015/0303937 A1 Oct. 22, 2015

(30) Foreign Application Priority Data
Apr. 22, 2014 (KR) ........................ 10-2014-0047839

(51) Int. Cl.
*H04N 5/378* (2011.01)
*H03M 1/14* (2006.01)
(Continued)

(52) U.S. Cl.
CPC .............. *H04N 5/378* (2013.01); *H03M 1/14* (2013.01); *H03M 1/468* (2013.01); *H03M 1/56* (2013.01)

(58) Field of Classification Search
CPC .......... H03M 1/14; H03M 1/468; H03M 1/56; H04N 5/378
See application file for complete search history.

(56) References Cited

U.S. PATENT DOCUMENTS

2005/0168368 A1* 8/2005 Ueno ...................... H03M 1/06
341/156
2009/0073018 A1* 3/2009 Mitikiri ................. H03M 1/145
341/156

(Continued)

OTHER PUBLICATIONS

Fang Tang et al., "Low-Power CMOS Image Sensor Based on Column-Parallel Single-Slope/SAR Quantization Scheme", IEEE Transactions on Electron Devices, Aug. 2013, pp. 2561-2566, vol. 60, No. 8.

(Continued)

*Primary Examiner* — Francis M Legasse, Jr.

(57) ABSTRACT

An analog-digital converting device includes a successive approximation register (SAR) analog-digital converting circuit suitable for resolving upper N-bits for an input signal, a single-slope (SS) analog-digital converting circuit suitable for resolving lower M-bits for the input signal after the SAR analog-digital converting circuit resolves the upper N-bits, and a combining circuit suitable for combining the upper N-bits and the lower M-bits.

20 Claims, 19 Drawing Sheets

(51) Int. Cl.
*H03M 1/46* (2006.01)
*H03M 1/56* (2006.01)

(56) References Cited

U.S. PATENT DOCUMENTS

2009/0316029 A1* 12/2009 Hagihara ............... H04N 5/357
  348/294
2013/0258157 A1* 10/2013 Nam ....................... H04N 5/225
  348/311

OTHER PUBLICATIONS

Shinichiro Matsuo et al., "8.9-Megapixel Video Image Sensor With 14-b Column-Parallel SA-ADC", IEEE Transactions on Electron Devices, Nov. 2009, pp. 2380-2389, vol. 56, No. 11.

* cited by examiner

US 9,667,899 B2

ANALOG-DIGITAL CONVERTING DEVICE AND METHOD HAVING A SUCCESSIVE APPROXIMATION REGISTER ANALOG-DIGITAL CONVERTING CIRCUIT AND A SINGLE-SLOP ANALOG-DIGITAL CONVERTING CIRCUIT, AND IMAGE SENSOR INCLUDING THE SAME

CROSS-REFERENCE TO RELATED APPLICATIONS

The present application claims priority of Korean Patent Application No. 10-2014-0047839, filed on Apr. 22, 2014, which is incorporated herein by reference in its entirety.

BACKGROUND

1. Field

Embodiments of the present invention relate to an analog-digital converting device and method, and more particularly, to an analog-digital converting device and method that includes a successive approximation register (SAR) analog-digital converting circuit and a single-slope (SS) analog-digital converting circuit and an image sensor including the same.

2. Description of the Related Art

In the design of a complementary metal-oxide semiconductor (CMOS) image sensor, a successive approximation register (SAR) analog-digital converting device has been developed to overcome the low resolution and the long analog-digital converting time of a conventional single-slope (SS) analog-digital converting device.

Since an SAR analog-digital converting device includes a simple circuit having a capacitor digital-analog converter, a comparator and a logic unit, power consumption thereof is low.

However, since, in an SAR analog-digital converting device, the area of the digital-analog converter doubles when a resolution bit increases by one bit, a large area is used in an analog-digital converting device having a high resolution.

SUMMARY

Embodiments of the present invention are directed to an analog-digital converting device and method, which includes a successive approximation register (SAR) analog-digital converting circuit and a single-slope (SS) analog-digital converting circuit, and an image sensor including the same.

An analog-digital converting device and method resolves upper N bits (N is an integer) through one of the SAR analog-digital converting circuit and the SS analog-digital converting circuit and resolves lower M bits (M is an integer) through the other one of the SAR analog-digital converting circuit and the SS analog-digital converting circuit.

In accordance with an embodiment of the present invention, an analog-digital converting device includes a successive approximation register (SAR) analog-digital converting circuit suitable for resolving upper N-bits for an input signal; a single-slope (SS) analog-digital converting circuit suitable for resolving lower M-bits for the input signal; and a combining circuit suitable for combining the upper N-bits and the lower M-bits to provide an output signal having (N+M) bits, M and N being positive integers.

The SS analog-digital converting circuit may resolve the lower M-bits using a remaining voltage of the input signal after the SAR analog-digital converting circuit resolves the upper N-bits.

The SAR analog-digital converting circuit may include a capacitor digital-analog converting unit suitable for selecting one of a first reference voltage and a second reference voltage based on a comparison result of a comparator; the comparator suitable for comparing an output voltage of the capacitor digital-analog converting unit with the second reference voltage; and a memory unit suitable for storing the comparison result of the comparator.

The capacitor digital-analog converting unit may output a remaining voltage of the input signal after the SAR analog-digital converting circuit completes a resolution operation to provide the upper N-bits.

The SS analog-digital converting circuit may include a ramp signal generator suitable for generating a ramp signal, which is synchronized with a clock signal; a capacitor digital-analog converting unit suitable for outputting a voltage changing from a remaining voltage of the input signal after the SAR analog-digital converting circuit resolves the upper N-bits, based on the ramp signal; a comparator suitable for comparing an output voltage of the capacitor digital-analog converting unit with the second reference voltage; and a counter suitable for counting the number of clock cycles of the clock signal until a logic value of a comparison result of the comparator is changed.

An output terminal of the ramp signal generator may be coupled to a sampling capacitor of a capacitor digital-analog converting unit of the SAR analog-digital converting circuit.

The ramp signal generator may provide the ramp signal, which has a plurality of steps and a step size of (second reference voltage−first reference voltage)/$2^M$, to the sampling capacitor.

The SAR analog-digital converting circuit may share a capacitor digital-analog converting unit and a comparator with the SS analog-digital converting circuit.

In accordance with another embodiment of the present invention, an analog-digital converting method may include resolving upper N-bits for an input signal using a successive approximation register (SAR) analog-digital converting circuit; resolving lower M-bits for the input signal using a single-slope (SS) analog-digital converting circuit; and combining the upper N-bits and the lower M-bits to provide an output signal having (N+M) bits.

The resolving of the lower M-bits may include resolving the lower M-bits using a remaining voltage of the input signal after the SAR analog-digital converting circuit resolves the upper N-bits.

The resolving of the lower M-bits may include providing a ramp signal generated from a ramp signal generator to a sampling capacitor of a capacitor digital-analog converting unit of the SAR analog-digital converting circuit.

In accordance with another embodiment of the present invention, a complementary metal-oxide semiconductor (CMOS) image sensor include a pixel array suitable for generating a pixel signal; a successive approximation register (SAR) and single-slope (SS) analog-digital converting device suitable for resolving upper N-bits for the pixel signal using an SAR analog-digital converting circuit, resolving lower M-bits for the pixel signal using an SS analog-digital converting circuit, and combining the upper N-bits and the lower M-bits to provide a digital pixel signal having (N+M) bits; and an image signal processing circuit suitable for performing image processing on the digital pixel signal output from the SAR and SS analog-digital converting device.

The SS analog-digital converting circuit may resolve the lower M-bits using a remaining voltage of the pixel signal after the SAR analog-digital converting circuit resolves the upper M-bits.

The SAR analog-digital converting circuit may include a capacitor digital-analog converting unit suitable for selecting one of a first reference voltage and a second reference voltage based on a comparison result of a comparator; the comparator suitable for comparing an output voltage of the capacitor digital-analog converting unit with the second reference voltage; and a memory unit suitable for storing the comparison result of the comparator.

The SS analog-digital converting circuit may include a ramp signal generator suitable for generating a ramp signal, which is synchronized with a clock signal; a capacitor digital-analog converting unit suitable for outputting a voltage changing from a remaining voltage of the pixel signal after the SAR analog-digital converting circuit resolves the upper N-bits, based on the ramp signal; a comparator suitable for comparing an output voltage of the capacitor digital-analog converting unit with a second reference voltage; and a counter suitable for counting the number of clock cycles of the clock signal until a logic value of a comparison result of the comparator is changed.

An output terminal of the ramp signal generator may be coupled to a sampling capacitor of a capacitor digital-analog converting unit of the SAR analog-digital converting circuit.

In accordance with another embodiment of the present invention, an analog-digital converting device may include a single-slope (SS) analog-digital converting circuit suitable for resolving upper N-bits for an input signal; a successive approximation register (SAR) analog-digital converting circuit suitable for resolving lower M-bits for the input signal; and a combining circuit suitable for combining the upper N-bits and the lower M-bits to provide an output signal having (N+M) bits.

The SAR analog-digital converting circuit may resolve the lower M-bits using a remaining voltage of the input signal after the SS analog-digital converting circuit resolves the upper N-bits.

In accordance with another embodiment of the present invention, an analog-digital converting method may include resolving upper N-bits for an input signal using a single-slope (SS) analog-digital converting circuit; resolving lower M-bits for the input signal using a successive approximation register (SAR) analog-digital converting circuit; and combining the upper N-bits and the lower M-bits to provide an output signal having (N+M) bits.

In accordance with another embodiment of the present invention, a complementary metal-oxide semiconductor (CMOS) image sensor may include a pixel array suitable for generating a pixel signal; a single-slope (SS) and successive approximation register (SAR) analog-digital converting device suitable for resolving upper N-bits for the pixel signal using an SS analog-digital converting circuit, resolving lower M-bits for the pixel signal using an SAR analog-digital converting circuit, and combining the upper N-bits and the lower M-bits to provide a digital pixel signal having (N+M) bits; and an image signal processing circuit suitable for performing image processing on the digital pixel signal output from the SS and SAR analog-digital converting device.

DETAILED DESCRIPTION

Figure 1:
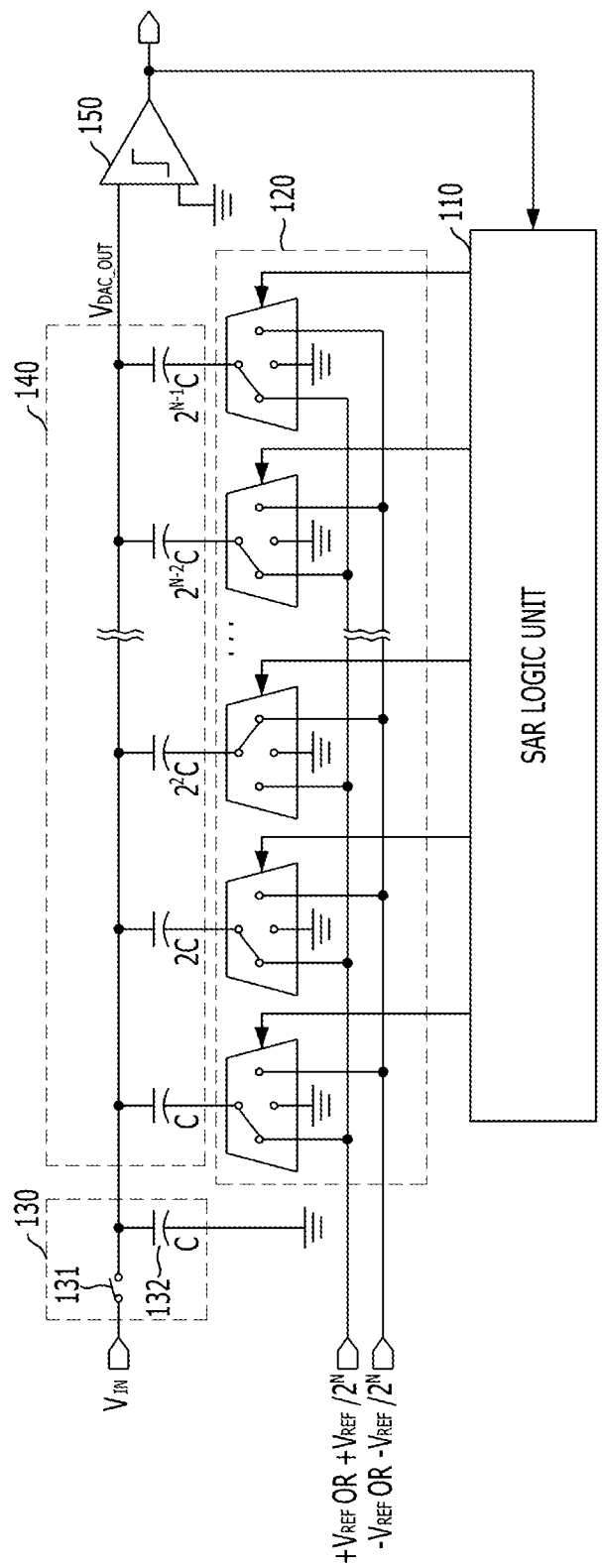
FIG. 1 illustrates a two-stage SAR analog-digital converting device.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete. Throughout the disclosure, like reference numerals correspond to like parts in the various figures and embodiments of the present invention.

The drawings are not necessarily to scale and in some instances, proportions may have been exaggerated in order to clearly illustrate features of embodiments. In this specification, specific terms have been used. The terms are used to describe embodiments, and are not used to qualify or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form unless specifically mentioned in a sentence. Furthermore, 'include/comprise' or 'including/comprising' used in the specification represents that one or more components, steps, operations, and elements may exist or be added.

FIG. 1 is a circuit diagram illustrating a two-stage SAR analog-digital converting device.

Referring to FIG. 1, the two-stage SAR analog-digital converting device may include an SAR logic circuit 110, a switch unit 120, a sampling unit 130, a capacitor unit 140 and a comparator 150.

The SAR logic circuit 110 receives an output signal of the comparator 150, generates a control signal using a predetermined SAR logic, and provides the control signal to the switching unit 120. The switching unit 120 selects and transfers a first reference voltage ($+V_{REF}$ or $+V_{REF}/2^N$) or a second reference voltage ($-V_{REF}$ or $-V_{REF}/2^N$) in response to the control signal.

The sampling unit 130 performs a sampling operation on a pixel signal $V_{IN}$ provided from a pixel array (not shown) and transfers a sampled pixel signal to the capacitor unit 140. The sampling unit 130 includes a sampling switch 131 and a sampling capacitor 132.

One terminal of the capacitor unit 140 is coupled to an output node of the sampling unit 130, and the other terminal of the capacitor unit 140 is coupled to an output node of the switching unit 120. The comparator 150 receives an output signal ($V_{DAC\_OUT}$) of the capacitor unit 140 and performs a comparison operation. Herein, the switching unit 120, the sampling unit 130 and the capacitor unit 140 may be referred to as a digital-analog converting circuit (DAC).

Since the two-stage SAR analog-digital converting device includes a simple circuit such as the digital-analog converting circuit 120 to 140, the comparator 150 and the SAR logic circuit 110, power consumption thereof is low. However, in general, since the area of the digital-analog converting circuit doubles when a resolution bit increases by one bit, a high resolution two-stage SAR analog-digital converting device often utilizes a large area.

In order to reduce the area of the digital-analog converting circuit, a conventional two-stage SAR analog-digital converting device uses a first reference voltage ($+V_{REF}$ or $+V_{REF}/2^N$) and a second reference voltage ($-V_{REF}$ or $-V_{REF}/2^N$). However, it is difficult to have high linearity in this technology since the first and second reference voltages need a high degree of accuracy.

An SAR and SS analog-digital converting device in accordance with an embodiment of the present invention resolves upper N-bits for an input signal, e.g., an analog pixel signal, using an SAR analog-digital converting device, resolves lower M-bits for the analog pixel signal using an SS analog-digital converting device, and thus generates a digital pixel signal having (N+M) bits. The remaining voltage of the analog pixel signal after the SAR analog-digital converting device resolves the upper N-bits is stored in a capacitor digital-analog converting unit.

In order to resolve the lower M-bits, a ramp signal is provided to a lowermost capacitor of the capacitor digital-analog converting unit in an embodiment of the present invention. As a result, in an embodiment of the present invention, the area of the SAR analog-digital converting device may be reduced, and the desired degree of accuracy of a plurality of reference voltages may be reduced. Moreover, since the desired degree of accuracy of the ramp signal generation of the SS analog-digital converting device may be reduced, and an SAR and SS analog-digital converting device in accordance with an embodiment of the present invention may not be sensitive to a parasitic capacitor at an output terminal of a capacitor digital-analog converting unit, an analog-digital converting device having a high resolution and a high linearity can be implemented. This will be described further with reference to accompanying drawings.

Figure 2:
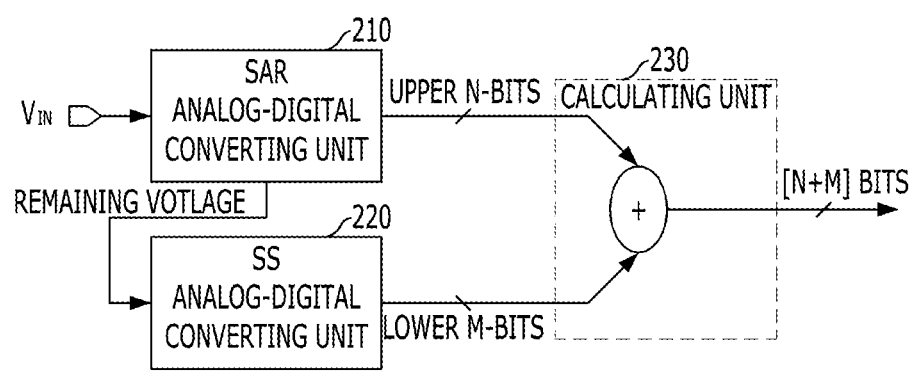
FIG. 2 is a block diagram illustrating an SAR and SS analog-digital converting device in accordance with an embodiment of the present invention.

FIG. 2 illustrates an SAR and SS analog-digital converting device in accordance with an embodiment of the present invention.

Referring to FIG. 2, an SAR and SS analog-digital converting device may include an SAR analog-digital converting circuit 210, an SS analog-digital converting circuit 220 and a combining circuit 230.

The SAR analog-digital converting circuit 210 resolves upper N-bits for a pixel signal $V_{IN}$ (that is, input signal). The SS analog-digital converting circuit 220 resolves lower M-bits for the pixel signal $V_{IN}$, which are not resolved by the SAR analog-digital converting circuit 210. The combining circuit 230 combines the upper N-bits, which are resolved by the SAR analog-digital converting circuit 210, with the lower M-bits, which are resolved by the SS analog-digital converting circuit 220 to provide an output signal having (N+M) bits.

More specifically, in order to obtain an analog-digital resolution result of (N+M) bits, the SAR analog-digital converting circuit 210 performs a sampling operation on the pixel signal $V_{IN}$ and resolves the upper N-bits. The SS analog-digital converting circuit 220 resolves, using the remaining voltage after the SAR analog-digital converting circuit 210 resolves the upper N-bits, the lower M-bits for the pixel signal $V_{IN}$.

Figure 3:
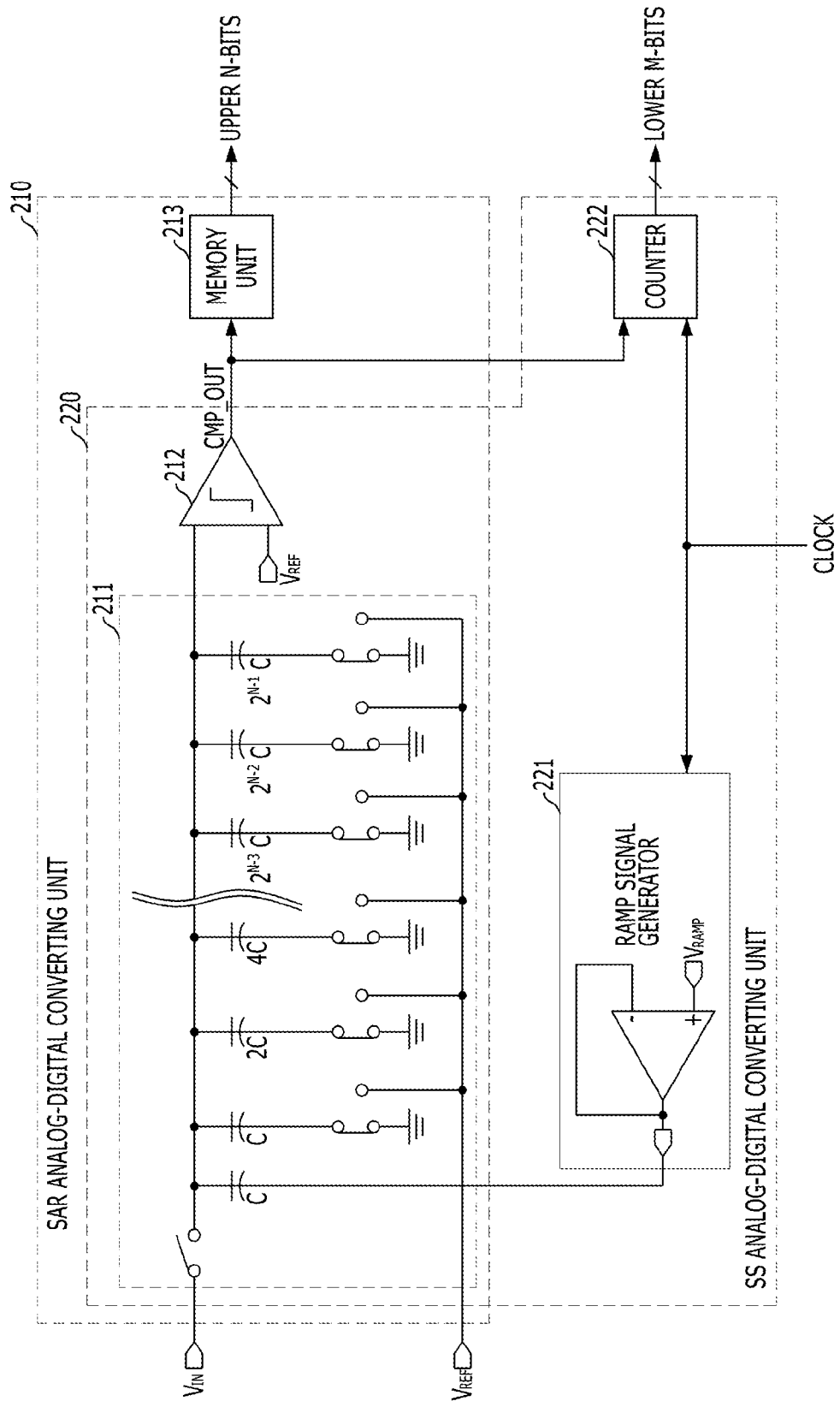
FIG. 3 illustrates an SAR analog-digital converting circuit and an SS analog-digital converting circuit shown in FIG. 2 in accordance with an embodiment of the present invention.

FIG. 3 illustrates an SAR analog-digital converting circuit and an SS analog-digital converting circuit in accordance with an embodiment.

Referring to FIG. 3, the SAR analog-digital converting circuit 210 may include a capacitor digital-analog converting unit 211, a comparator 212 and a memory unit 213.

The capacitor digital-analog converting unit 211 selects one of a first reference voltage GND and a second reference voltage $V_{REF}$ based on a comparison result CMP_OUT of the comparator 212. The comparator 212 compares an output voltage of the capacitor digital-analog converting unit 211 with the second reference voltage $V_{REF}$. The memory unit 213 stores the comparison result CMP_OUT of the comparator 212.

The SS analog-digital converting circuit 220 may include a ramp signal generator 221, the capacitor digital-analog converting unit 211, the comparator 212 and a counter 222.

The ramp signal generator 221 generates a ramp signal, which is synchronized with a clock signal. In an operation of the SS analog-digital converting circuit 220, the capacitor digital-analog converting unit 211 outputs an output voltage that changes depending on the ramp signal. The output voltage changes from the remaining voltage after the SAR analog-digital converting circuit 210 resolves the upper N-bits. The comparator 212 compares the output voltage of the capacitor digital-analog converting unit 211 with the second reference voltage $V_{REF}$. The counter 222 counts the number of clock cycles of the clock signal until a logic value of the comparison result CMP_OUT of the comparator 212 is changed and outputs an analog/digital converting result for the remaining voltage.

Herein, the SAR analog-digital converting circuit 210 and the SS analog-digital converting circuit 220 may share the comparator 212 and a part, e.g., a sampling capacitor, of the capacitor digital-analog converting unit 211.

More specifically, the capacitor digital-analog converting unit 211 performs a sampling operation on the pixel signal $V_{IN}$, and then the first reference voltage GND or the second reference voltage $V_{REF}$ is selectively provided to capacitors C to $2^{N-1}$C based on the comparison result from the comparator 212.

Since an SAR logic circuit (not shown) is substantially the same as the SAR logic circuit shown in FIG. 1, the SAR logic circuit is not shown in FIG. 3. The SAR logic circuit used in the SAR and SS analog-digital converting device shown in FIG. 3 generates a control signal controlling switches included in the capacitor digital-analog unit 211 based on the comparison result CMP_OUT of the comparator 212.

The comparator 212 compares the output voltage of the capacitor digital-analog converting unit 211 with the second reference voltage $V_{REF}$. The memory unit 213 includes an N-bit storage and stores comparison results of the comparator 212, which are sequentially output, from the uppermost bit to the lowermost bit of the N-bit storage.

Further, an output terminal of the ramp signal generator 221 is coupled to a lowermost capacitor, e.g., a sampling capacitor, of the capacitor digital-analog converting unit 211 including (N+1) capacitors. As the voltage level of the ramp signal output from the ramp signal generator 221 is changed, the output voltage of the capacitor digital-analog converting unit 211 changes from the remaining voltage in response to the ramp signal by a charge re-distribution. The comparator 212 compares the output voltage of the capacitor digital-analog converting unit 211 with the second reference voltage $V_{REF}$. The counter 222 and the ramp signal generator 221 receive a clock signal. The counter 222 outputs an analog-digital converted result for the remaining voltage by counting the number of clock cycles of the clock signal until a logic value of the output signal CMP_OUT of the comparator 212 is changed, e.g., until the output voltage of the capacitor digital-analog converting unit 211 reaches the second reference voltage $V_{REF}$. The analog-digital converted result output from the counter 222 corresponds to the lower M-bits.

Herein, the ramp signal generator 221 provides the ramp signal having a step-wave form. The ramp signal has a plurality of steps, the number of steps corresponding to $2^M$. A voltage difference between two steps, i.e., a step size, is determined by (second reference voltage $V_{REF}$–first reference voltage GND)/$2^M$. Thus, when the first reference voltage GND is '0', a voltage level of the ramp signal changes for each step by (second reference voltage $V_{REF}$)/$2^M$.

That is, in order to obtain the analog-digital resolution result of (N+M) bits, the memory unit 213 having the N-bit storage outputs the upper N-bits of the (N+M) bits and the counter 222 outputs the lower M bits of the (N+M) bits.

Figure 4:
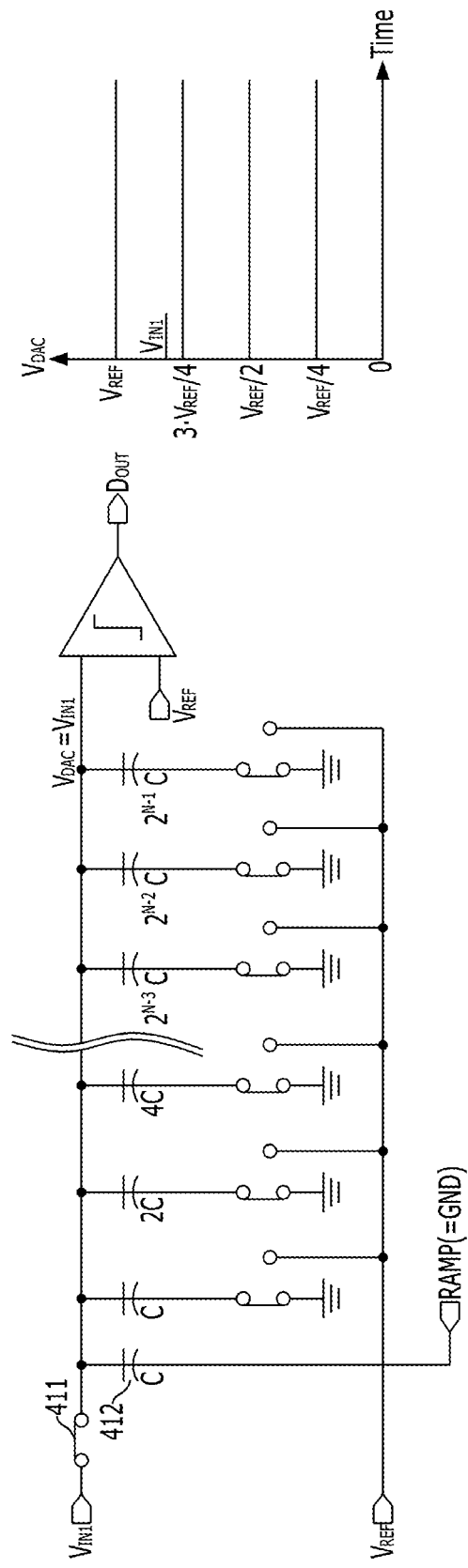
FIG. 4 is a diagram illustrating a sampling operation for a first pixel signal in an SAR and SS analog-digital converting device in accordance with an embodiment of the present invention.
Figure 5:
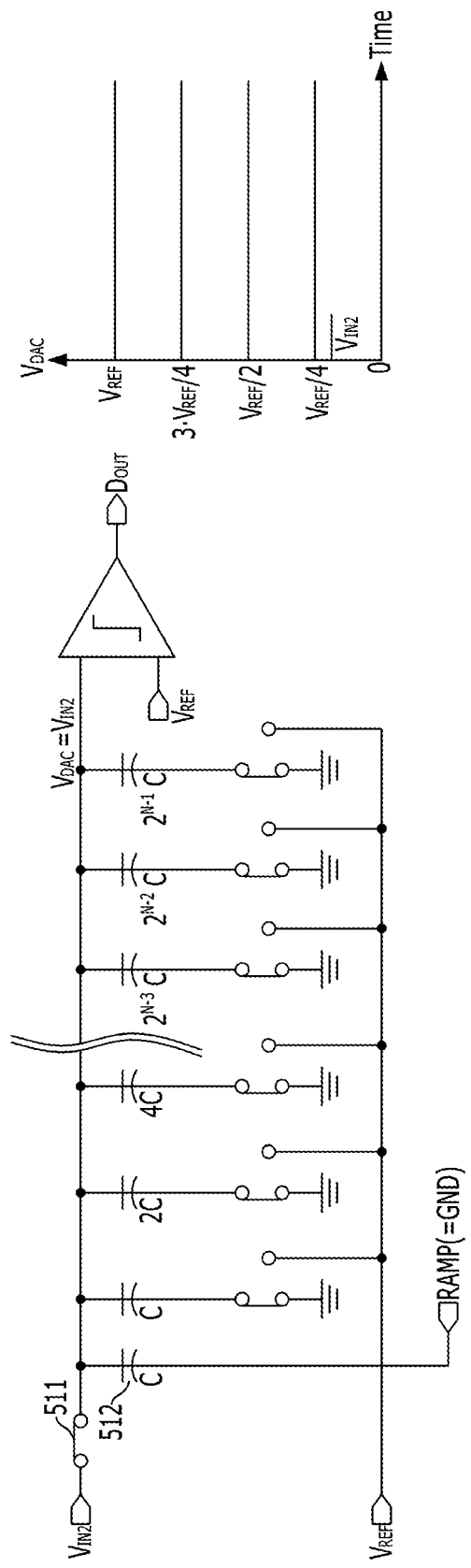
FIG. 5 is a diagram illustrating a sampling operation for a second pixel signal in an SAR and SS analog-digital converting device in accordance with an embodiment of the present invention.

FIG. 4 is a diagram illustrating a sampling operation for a first pixel signal in an SAR and SS analog-digital converting device in accordance with an embodiment of the present invention. FIG. 5 is a diagram illustrating a sampling operation for a second pixel signal in an SAR and SS analog-digital converting device in accordance with an embodiment of the present invention.

In FIGS. 4 and 5, a first pixel signal $V_{IN1}$ and a second pixel signal $V_{IN2}$ will be shown in order to more specifically describe an operation of a capacitor digital-analog converting unit according to an amplitude of an input signal, e.g., the first pixel signal $V_{IN1}$ or the second pixel signal $V_{IN2}$.

Herein, a first pixel signal $V_{IN1}$ having a higher voltage level than a half of the second reference voltage $V_{REF}$ and a second pixel signal $V_{IN2}$ having a lower voltage level than a half of the second reference voltage $V_{REF}$ are used. In case of the first pixel signal $V_{IN1}$, a resolution result of upper 3-bits is "111", and in case of the second pixel signal $V_{IN2}$, a resolution result of upper 3-bits is "000".

Referring to FIG. 4, if the first pixel signal $V_{IN1}$ is sampled, a sampling switch 411 is switched on, and a ground voltage GND is provided to a sampling capacitor 412 and the other capacitors C to $2^{N-1}$C in the capacitor digital-analog converting unit 211. An output voltage $V_{DAC}$ of the capacitor digital-analog converting unit 211 is substantially the same as the input voltage (that is, first pixel signal $V_{IN1}$), and has a voltage level between $V_{REF}$ and $3V_{REF}/4$.

Referring to FIG. 5, if the second pixel signal $V_{IN2}$ is sampled, a sampling switch 511 is switched on, and a ground voltage GND is provided to a sampling capacitor 512 and the other capacitors C to $2^{N-1}$C in the capacitor digital-analog converting unit 211. An output voltage $V_{DAC}$ of the capacitor digital-analog converting unit 211 is substantially the same as the input voltage (that is, second pixel signal $V_{IN2}$), and has a voltage level between $V_{REF}/4$ and '0'.

Figure 6:
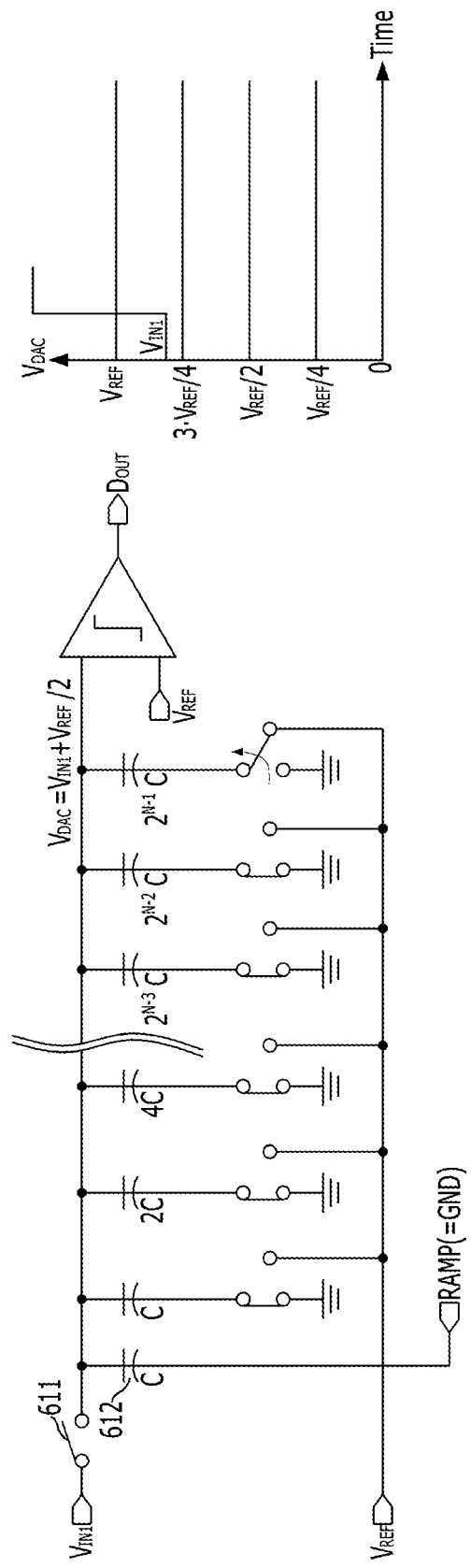
FIG. 6 is a diagram illustrating an uppermost bit resolution operation for a first pixel signal sampled in an SAR and SS analog-digital converting device in accordance with an embodiment of the present invention.

FIG. 6 is a diagram illustrating an uppermost bit resolution operation for a first pixel signal $V_{IN1}$ sampled in an SAR and SS analog-digital converting device in accordance with an embodiment of the present invention.

Referring to FIG. 6, during an uppermost bit resolution operation, in order to determine whether the first pixel signal $V_{IN1}$ is larger or smaller than a half of a second reference voltage $V_{REF}$, a sampling switch 611 is switched off, and a ground voltage GND is provided to a sampling capacitor 612. The second reference voltage $V_{REF}$ is provided to a lower terminal of a capacitor $2^{N-1}$C, and the ground voltage GND is provided to lower terminals of the other capacitors C to $2^{N-2}$C. Thus, an output voltage $V_{DAC}$ of the capacitor digital-analog converting unit 211 becomes substantially the same as the sum of the input voltage (that is, first pixel signal $V_{IN1}$) and a half of the second reference voltage, i.e., $V_{REF}/2$. That is, the output voltage $V_{DAC}$ of the capacitor digital-analog converting unit 211, which had the same voltage level as the first pixel signal $V_{IN1}$ having a voltage level between $V_{REF}$ and $3V_{REF}/4$, is increased by a half of the second reference voltage $V_{REF}/2$ by coupling the lower terminal of the capacitor $2^{N-1}C$ to a terminal to which the second reference voltage $V_{REF}$ is provided after the sampling operation is performed on the first pixel signal $V_{IN1}$. The uppermost bit of upper N-bits is resolved by comparing the output voltage $V_{DAC}$ of the capacitor digital-analog converting unit 211 with the second reference voltage $V_{REF}$. As shown in FIG. 6, if the output voltage $V_{DAC}$ of the capacitor digital-analog converting unit 211 is higher than the second reference voltage $V_{REF}$, the uppermost bit is determined to be '1'.

Figure 7:
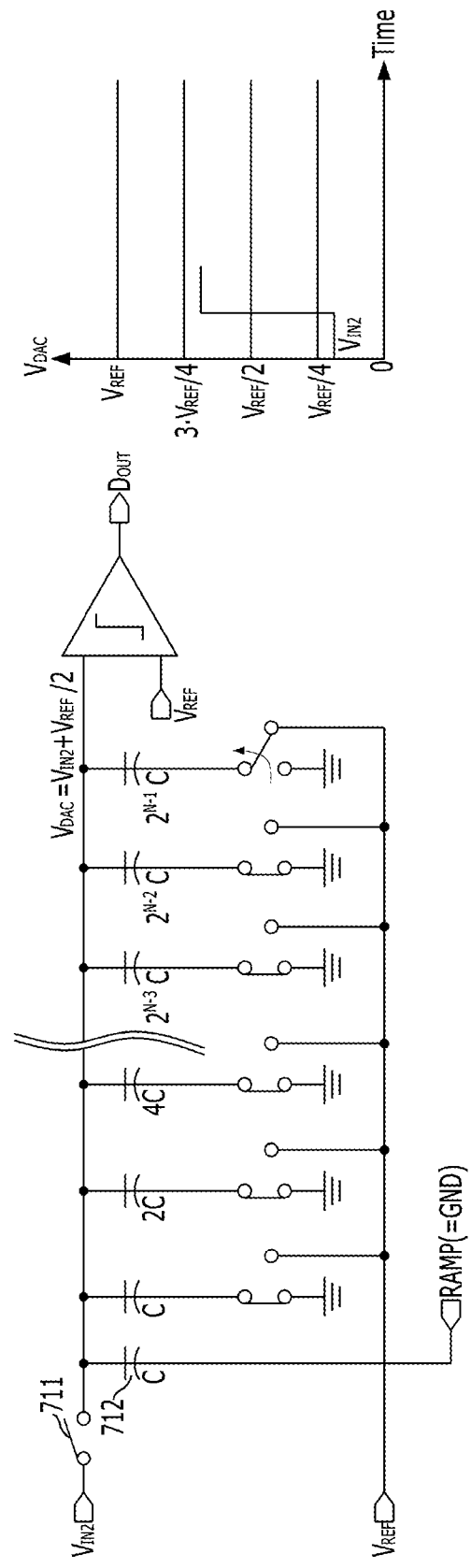
FIG. 7 is a diagram illustrating an uppermost bit resolution operation for a second pixel signal sampled in an SAR and SS analog-digital converting device in accordance with an embodiment of the present invention.

FIG. 7 is a diagram illustrating an uppermost bit resolution operation for a second pixel signal $V_{IN2}$ sampled in an SAR and SS analog-digital converting device in accordance with an embodiment of the present invention.

Referring to FIG. 7, during an uppermost bit resolution operation, in order to determine whether the second pixel signal $V_{IN2}$ is larger or smaller than a half of the second reference voltage $V_{REF}$, a sampling switch 711 is switched off, and a ground voltage GND is provided to a sampling capacitor 712. The second reference voltage $V_{REF}$ is provided to a lower terminal of a capacitor $2^{N-1}C$, and the ground voltage GND is provided to lower terminals of the other capacitors C to $2^{N-2}C$. Thus, an output voltage $V_{DAC}$ of the capacitor digital-analog converting unit 211 becomes substantially the same as the sum of the input voltage (that is, second pixel signal $V_{IN2}$) and a half of the second reference voltage, i.e., $V_{REF}/2$. That is, the output voltage $V_{DAC}$ of the capacitor digital-analog converting unit 211, which had the same voltage level as the second pixel signal $V_{IN2}$ having a voltage level between $V_{REF}/4$ and '0', is increased by a half of the second reference voltage $V_{REF}/2$ by coupling the lower terminal of the capacitor $2^{N-1}C$ to a terminal to which the second reference voltage $V_{REF}$ is provided after the sampling operation is performed on the second pixel signal $V_{IN2}$. The uppermost bit of upper N-bits is resolved by comparing the output voltage $V_{DAC}$ of the capacitor digital-analog converting unit 211 with the second reference voltage $V_{REF}$. As shown in FIG. 7, if the output voltage $V_{DAC}$ of the capacitor digital-analog converting unit 211 is smaller than the second reference voltage $V_{REF}$, the uppermost bit is determined to be '0'.

Figure 8:
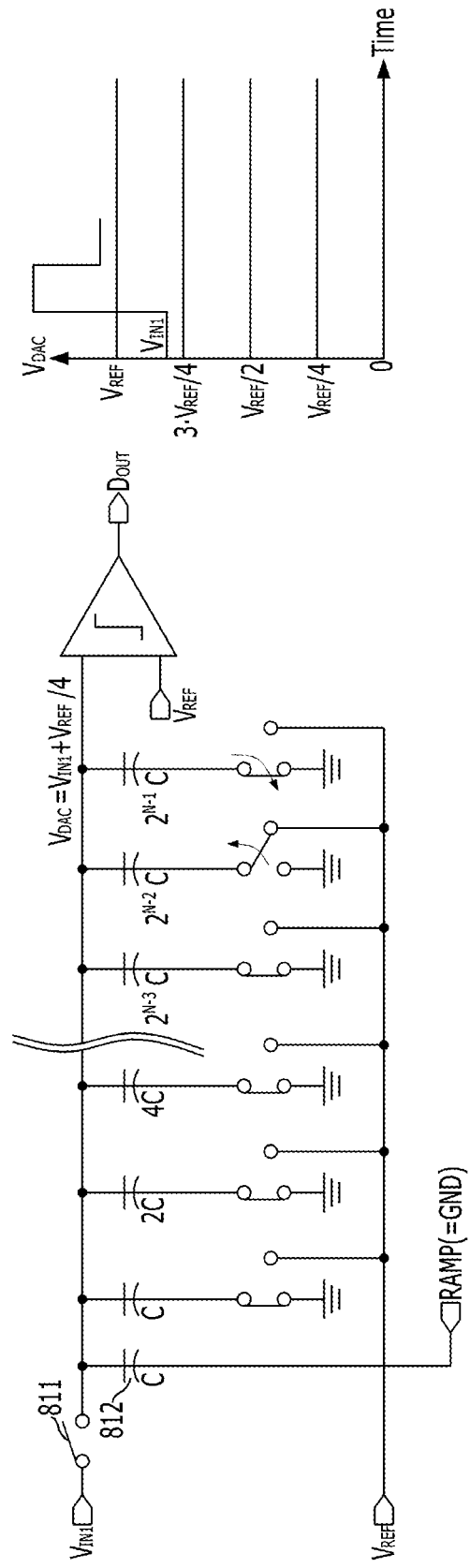
FIG. 8 is a diagram illustrating a second bit resolution operation for a first pixel signal sampled in an SAR and SS analog-digital converting device in accordance with an embodiment of the present invention.

FIG. 8 is a diagram illustrating a second bit resolution operation for a first pixel signal $V_{IN1}$ sampled in an SAR and SS analog-digital converting device in accordance with an embodiment of the present invention.

Referring to FIG. 8, after the uppermost bit resolution operation for the first pixel signal $V_{IN1}$ is completed, e.g., as described with reference to FIG. 6, while the capacitor digital-analog converting unit 211 resolves a second bit for the first pixel signal $V_{IN1}$, a sampling switch 811 is switched off, and a ground voltage GND is provided to a sampling capacitor 812. Since the uppermost bit is determined to be '1' as a result of the uppermost bit resolution operation, a second reference voltage $V_{REF}$ is provided to a lower terminal of a capacitor $2^{N-2}C$, and a ground voltage GND is provided to lower terminals of the other capacitors C to $2^{N-3}C$ and $2^{N-1}C$. Thus, an output voltage $V_{DAC}$ of the capacitor digital-analog converting unit 211 is changed by a quarter of the second reference voltage, i.e., $V_{REF}/4$, when the uppermost bit is '1'. A second bit of the upper N-bits is resolved by comparing the output voltage $V_{DAC}$ of the capacitor digital-analog converting unit 211 with the second reference voltage $V_{REF}$. As shown in FIG. 8, if the output voltage $V_{DAC}$ of the capacitor digital-analog converting unit 211 is higher than the second reference voltage $V_{REF}$, the second bit is determined to be '1'.

Figure 9:
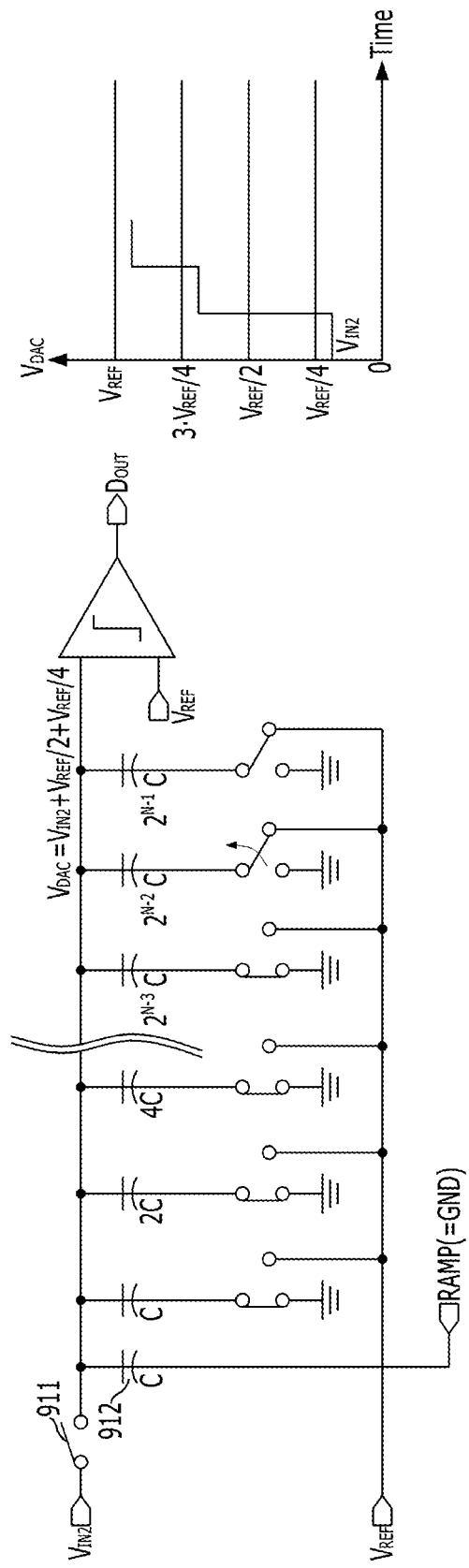
FIG. 9 is a diagram illustrating a second bit resolution operation for a second pixel signal sampled in an SAR and SS analog-digital converting device in accordance with an embodiment of the present invention.

FIG. 9 is a diagram illustrating a second bit resolution operation of a second pixel signal $V_{IN2}$ sampled in an SAR and SS analog-digital converting device in accordance with an embodiment of the present invention.

Referring to FIG. 9, after the uppermost bit resolution operation for the second pixel signal $V_{IN2}$ is completed, e.g., as described with reference to FIG. 7, while the capacitor digital-analog converting unit 211 resolves a second bit for the second pixel signal $V_{IN2}$, a sampling switch 911 is switched off, and a ground voltage GND is provided to a sampling capacitor 912. Since the uppermost bit is determined to be '0' as a result of the uppermost bit resolution operation, a second reference voltage $V_{REF}$ is provided to a lower terminal of capacitors $2^{N-1}C$ and $2^{N-2}C$, and a ground voltage GND is provided to lower terminals of the other capacitors C to $2^{N-3}C$. Thus, an output voltage $V_{DAC}$ of the capacitor digital-analog converting unit 211 is changed by the sum of a half of the second reference voltage, $V_{REF}/2$, and a quarter of the second reference voltage, $V_{REF}/4$, when the uppermost bit is '0'. A second bit of the upper N-bits is resolved by comparing the output voltage $V_{DAC}$ of the capacitor digital-analog converting unit 211 with the second reference voltage $V_{REF}$. As shown in FIG. 9, if the output voltage $V_{DAC}$ of the capacitor digital-analog converting unit 211 is lower than the second reference voltage $V_{REF}$, the second bit is determined to be '0'.

Figure 10:
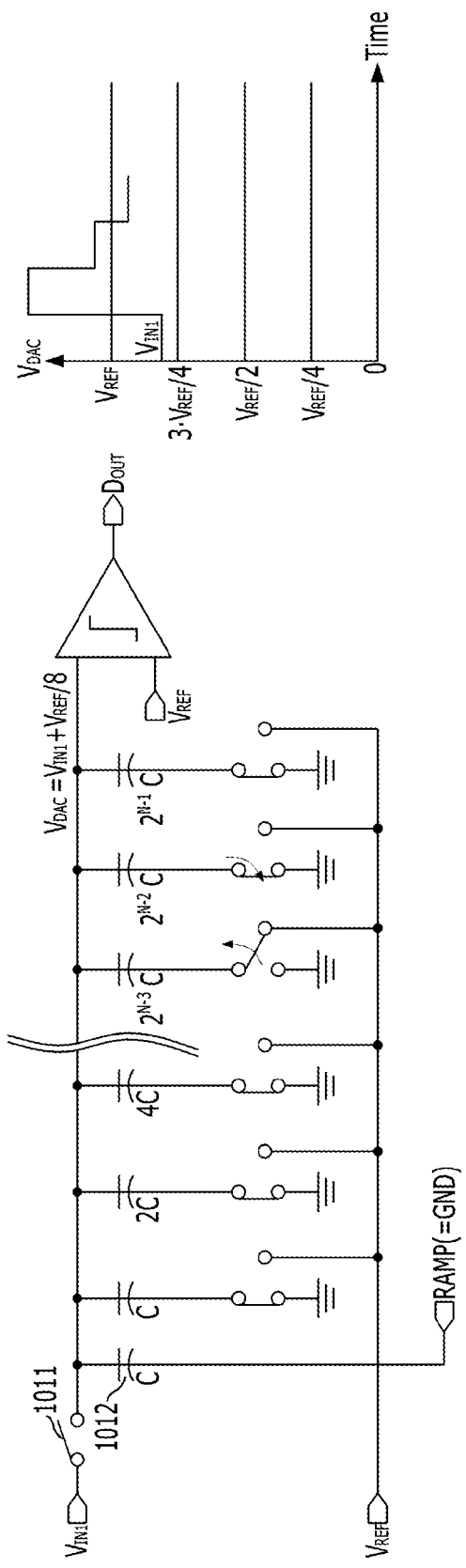
FIG. 10 is a diagram illustrating a third bit resolution operation for a first pixel signal sampled in an SAR and SS analog-digital converting device in accordance with an embodiment of the present invention.

FIG. 10 is a diagram illustrating a third bit resolution operation for a first pixel signal $V_{IN1}$ sampled in an SAR and SS analog-digital converting device in accordance with an embodiment of the present invention.

Referring to FIG. 10, after the second bit resolution operation for the first pixel signal $V_{IN1}$ is completed, e.g., as described with reference to FIG. 8, while the capacitor digital-analog converting unit 211 resolves a third bit for the first pixel signal $V_{IN1}$, a sampling switch 1011 is switched off, a ground voltage GND is provided to a sampling capacitor 1012 and a capacitor $2^{N-1}C$ maintains a coupling state thereof. Since the uppermost bit and the second bit are determined to be '11' in the uppermost and second bit resolution operations, a second reference voltage $V_{REF}$ is provided to a lower terminal of a capacitor $2^{N-3}C$, and a ground voltage GND is provided to lower terminals of a capacitor $2^{N-1}C$, a capacitor $2^{N-2}C$, and other capacitors C to $2^{N-4}C$. Thus, an output voltage $V_{DAC}$ of the capacitor digital-analog converting unit 211 is changed by one eighth of the second reference voltage, $V_{REF}/8$, when the uppermost bit and the second bit are '11'. The third bit of the upper N-bits is resolved by comparing the output voltage $V_{DAC}$ of the capacitor digital-analog converting unit 211 with the second reference voltage $V_{REF}$. As shown in FIG. 10, in this case, since the output voltage $V_{DAC}$ of the capacitor digital-analog converting unit 211 becomes lower than the second reference voltage $V_{REF}$, a logic value of a comparison result of a comparator is changed. The third bit of the upper N-bits is determined to be '0'.

Figure 11:
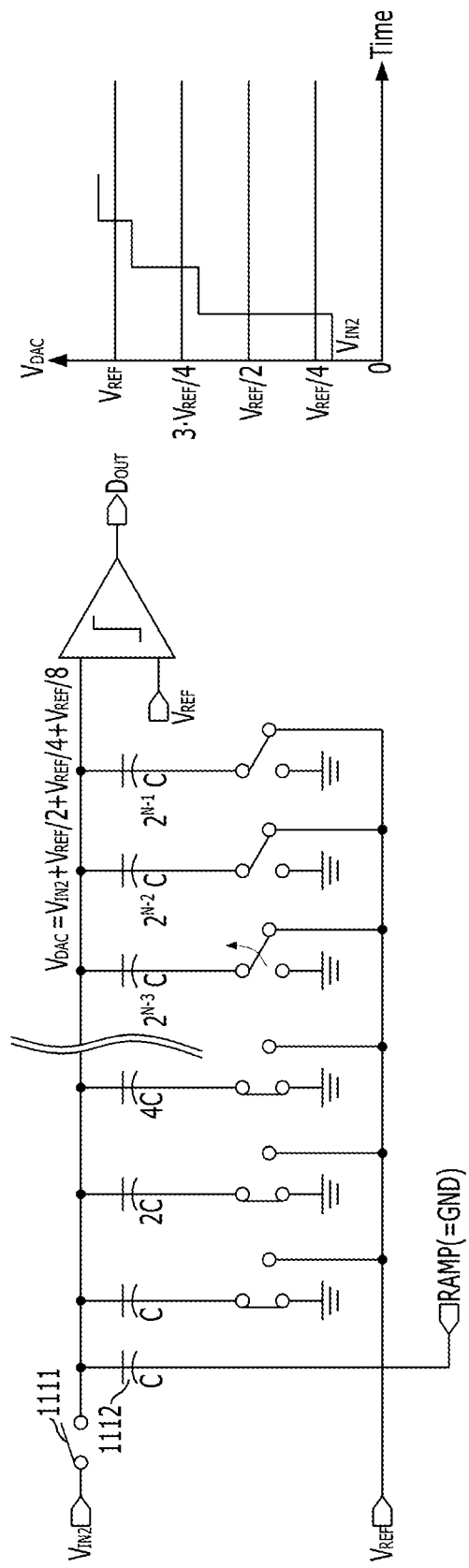
FIG. 11 is a diagram illustrating a third bit resolution operation for a second pixel signal sampled in an SAR and SS analog-digital converting device in accordance with an embodiment of the present invention.

FIG. 11 is a diagram illustrating a third bit resolution operation for a second pixel signal $V_{IN2}$ sampled in an SAR and SS analog-digital converting device in accordance with an embodiment of the present invention.

Referring to FIG. 11, after the second bit resolution operation for the second pixel signal $V_{IN2}$ is completed, e.g., as described with reference to FIG. 9, while the capacitor digital-analog converting unit 211 resolves a third bit for the second pixel signal $V_{IN2}$, a sampling switch 1111 is switched off, a ground voltage GND is provided to a sampling capacitor 1112 and a capacitor $2^{N-1}C$ maintains a coupling state thereof. Since the uppermost bit and the second bit are determined to be '00' in the uppermost and second bit resolution operations, a second reference voltage $V_{REF}$ is provided to lower terminals of capacitors $2^{N-3}C$, $2^{N-2}C$, and $2^{N-1}C$. Thus, an output voltage $V_{DAC}$ of the capacitor digital-analog converting unit 211 is changed by the sum of a half of the second reference voltage, $V_{REF}/2$, a quarter of the second reference voltage, $V_{REF}/4$, and one eighth of the second reference voltage, $V_{REF}/8$, when the uppermost bit and the second bit are '00'. The third bit is resolved by comparing the output voltage $V_{DAC}$ of the capacitor digital-analog converting unit 211 with the second reference voltage $V_{REF}$. As shown in FIG. 11, in this case, since the output voltage $V_{DAC}$ of the capacitor digital-analog converting unit 211 becomes higher than the second reference voltage $V_{REF}$, a logic value of a comparison result of a comparator is changed. The third bit of the upper N-bits is determined to be '1'.

Figure 12:
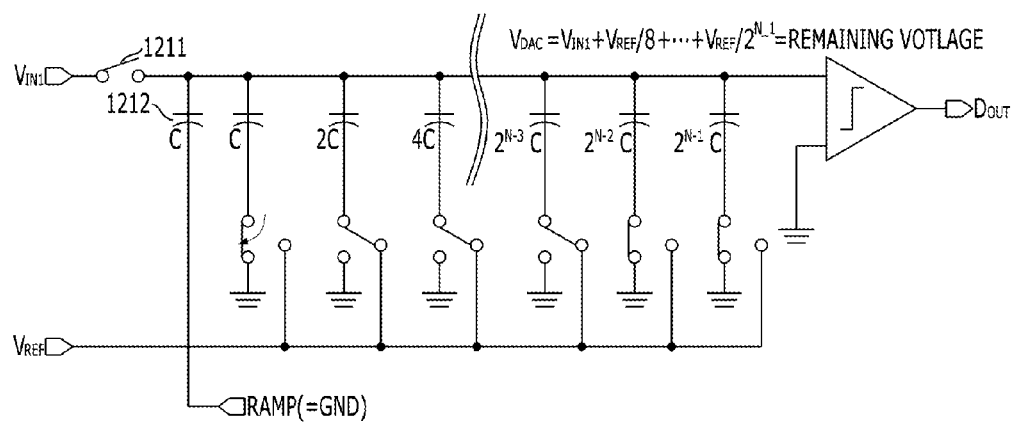
FIGS. 12 and 13 are diagrams illustrating configurations of a capacitor digital-analog converting unit after a lowermost bit resolution operation for a first pixel signal is completed in an SAR and SS analog-digital converting device in accordance with an embodiment of the present invention.
Figure 13:
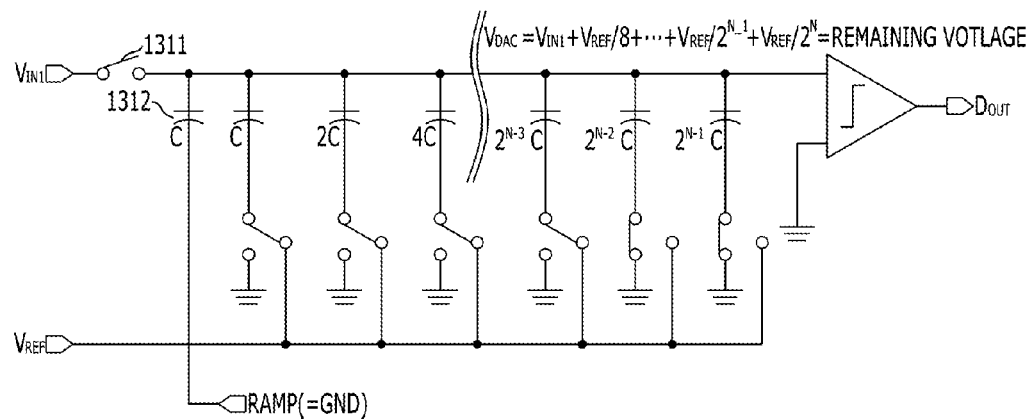

FIGS. 12 and 13 are diagrams illustrating configurations of the capacitor digital-analog converting unit 211 after a lowermost (Nth) bit resolution operation for a first pixel signal $V_{IN1}$ is completed in an SAR and SS analog-digital converting device in accordance with an embodiment of the present invention.

Referring to FIGS. 12 and 13, after the uppermost bit resolution operation to an (N−1)th bit resolution operation for the first pixel signal $V_{IN1}$ are completed, e.g., as described with reference to FIGS. 6, 8, and 10, while the capacitor digital-analog converting unit 211 resolves an $N^{th}$ bit (lowermost bit) for the first pixel signal $V_{IN1}$, a sampling switch 1211 or 1311 is switched off, a ground voltage GND is provided to a sampling capacitor 1212 or 1312.

A second reference $V_{REF}$ is coupled to a lower terminal of the lowermost capacitor C. Then, as shown in FIG. 12, if an output voltage $V_{DAC}$ of the capacitor digital-analog converting unit 211 is determined to be higher than the second reference voltage $V_{REF}$, that is, the $N^{th}$ bit is determined to be '1', the ground voltage GND is provided to the lower terminal of the lowermost capacitor C. As shown in FIG. 13, if the output voltage $V_{DAC}$ of the capacitor digital-analog converting unit 211 is determined to be lower than the second reference voltage $V_{REF}$, that is, the $N^{th}$ bit is determined to be '0', the second reference voltage $V_{REF}$ provided to a lower terminal of the lowermost capacitor C is maintained. Through the lowermost bit resolution operation, the capacitor digital-analog converting unit 211 outputs the remaining voltage, which is not resolved by the SAR analog-digital converting circuit 210. Herein, the remaining voltage shown in FIG. 12 is $V_{IN}+V_{REF}/8+\ldots+V_{REF}/2^{N-1}$, and the remaining voltage shown in FIG. 13 is $V_{IN}+V_{REF}/8+\ldots+V_{REF}/2^{N-1}+V_{REF}/2^N$.

Figure 14:
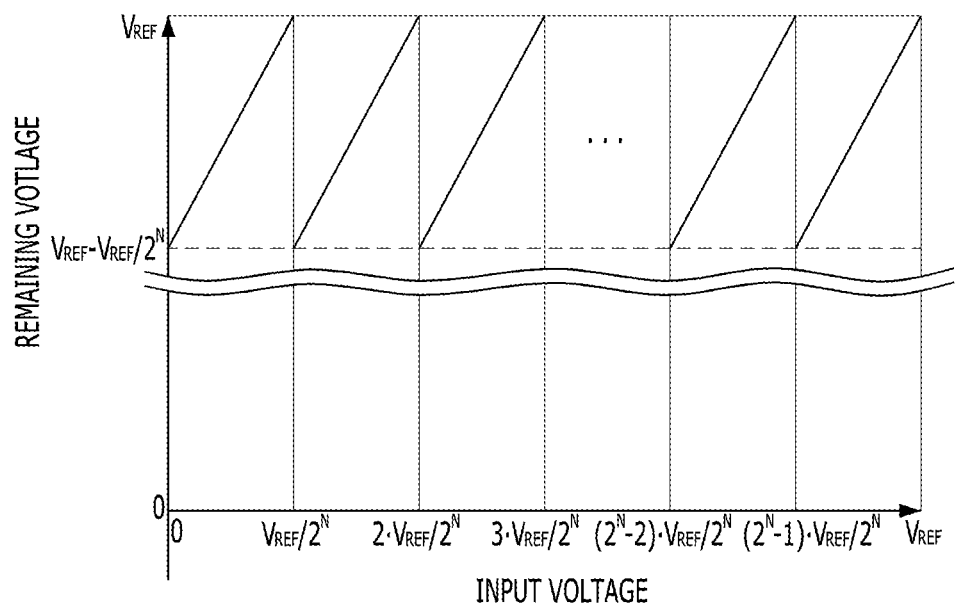
FIG. 14 is a diagram illustrating a remaining voltage of a pixel signal in an SAR and SS analog-digital converting device in accordance with an embodiment of the present invention.

FIG. 14 is a diagram illustrating a remaining voltage for a pixel signal in an SAR and SS analog-digital converting device in accordance with an embodiment of the present invention.

Referring to FIG. 14, after the $N^{th}$ bit resolution for the pixel signal $V_{IN}$, the remaining voltage outputted from the capacitor digital-analog converting unit 211 is higher than $V_{REF}-V_{REF}/2^N$ and lower than $V_{REF}$ as expressed by Equation 1.

$$V_{REF}-V_{REF}/2^N < \text{remaining voltage} < V_{REF} \quad \text{[Equation 1]}$$

Figure 15:
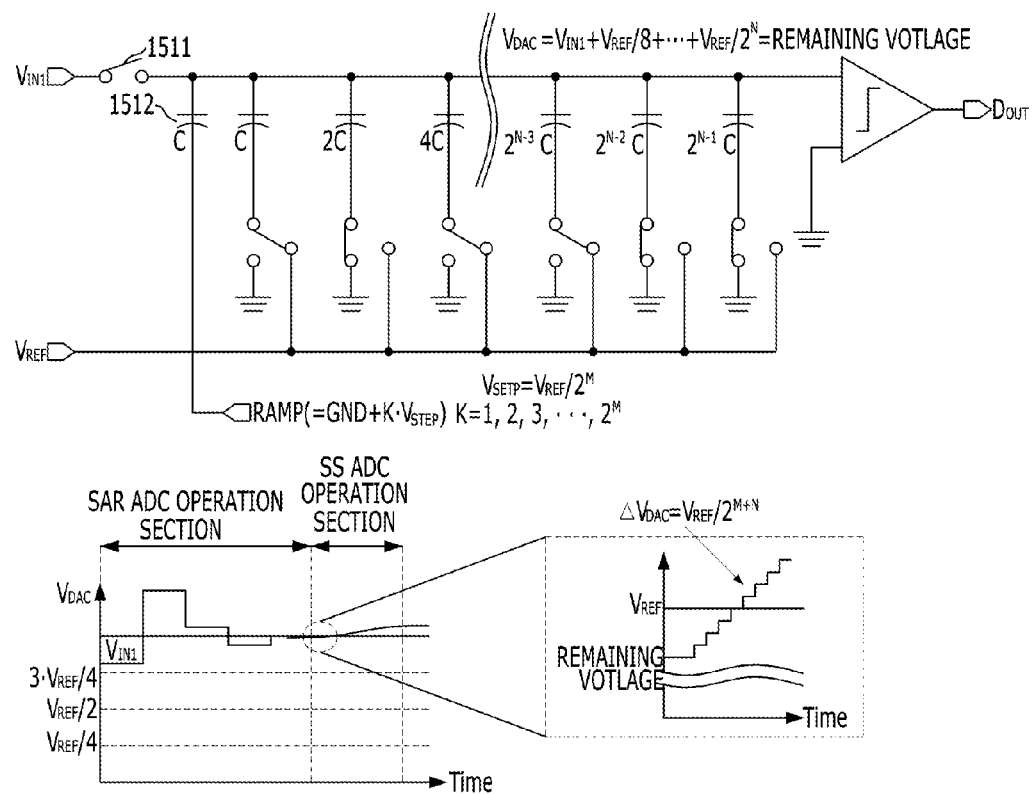
FIG. 15 is a diagram illustrating a remaining voltage resolution operation in an SAR and SS analog-digital converting device in accordance with an embodiment of the present invention.

FIG. 15 is a diagram illustrating a remaining voltage resolution operation in an SAR and SS analog-digital converting device in accordance with an embodiment of the present invention. More specifically, FIG. 15 shows an output voltage $V_{DAC}$ of the capacitor digital-analog converting unit 211 and the ramp signal supply of the SS analog-digital converting circuit 220 after the $N^{th}$ bit resolution operation of the pixel signal $V_{IN}$ at the SAR analog-digital converting circuit 210.

Referring to FIG. 15, while the SS analog-digital converting circuit 220 resolves the remaining voltage, a sampling switch 1511 is switched off, and a ramp signal GND+ $K \cdot V_{STEP}$, which is outputted from the ramp signal generator 221, is provided to a sampling capacitor 1512, wherein K is a constant of 1, 2, . . . , or $2^M$, and $V_{STEP}$ is $V_{REF}/2^M$.

That is, the ramp signal of the ramp signal generator 221 is provided to the sampling capacitor 1512 of the capacitor digital-analog converting unit 211 and is increased by $V_{REF}/2^M$ for each clock cycle of a clock signal. The clock signal is provided to the ramp signal generator 221 for $2^M$ clock cycles. As the ramp signal of the ramp signal generator 221 is changed by $V_{REF}/2^M$ for each clock cycle, the output voltage $V_{DAC}$ of the capacitor digital-analog converting unit 211 is changed by $V_{REF}/2^{M+1}$ through a charge re-distribution. The M-bit resolution for the remaining voltage is performed by counting the number of clock cycles of the clock signal until the output voltage $V_{DAC}$ of the capacitor digital-analog converting unit 211 reaches the second reference voltage $V_{REF}$.

As the voltage level of the remaining voltage lowers, more clock cycles are used until the output voltage $V_{DAC}$ of the capacitor digital-analog converting unit 211 reaches the second reference voltage $V_{REF}$.

Figure 16:
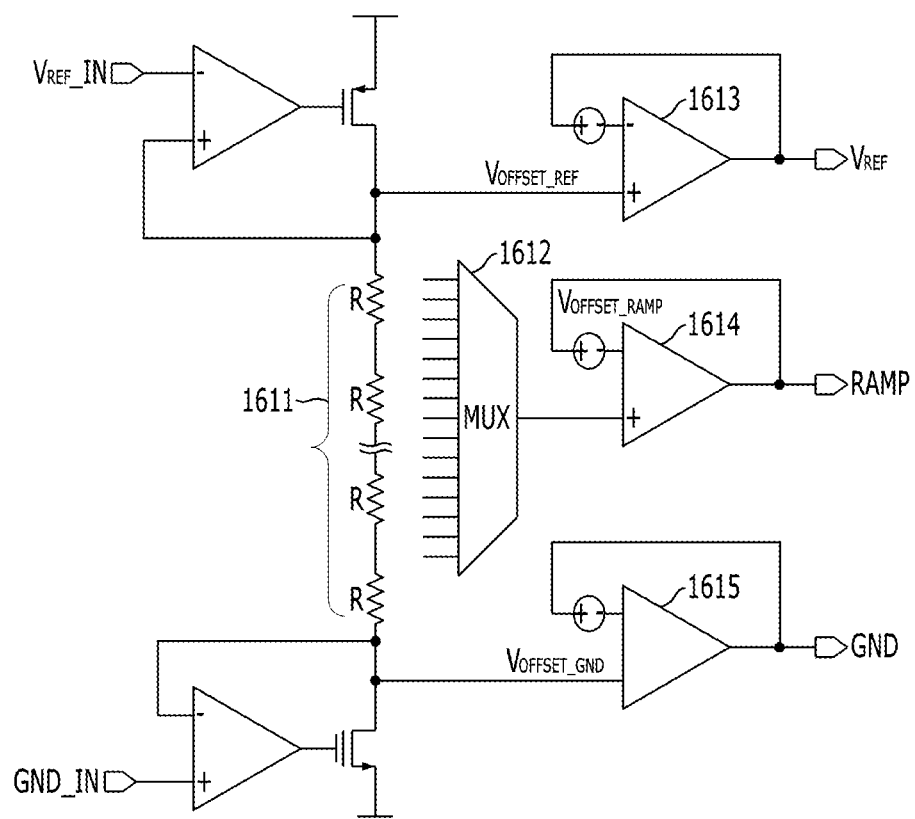
FIG. 16 is a circuit diagram illustrating a reference voltage provider for providing a reference voltage to an SAR analog-digital converting circuit, and a ramp signal generator of an SS analog-digital converting circuit in accordance with an embodiment of the present invention.

FIG. 16 is a circuit diagram illustrating a reference voltage provider for providing a reference voltage to an SAR analog-digital converting circuit, and a ramp signal generator of an SS analog-digital converting circuit in accordance with an embodiment of the present invention.

As described above, a ramp signal RAMP output from the ramp signal generator 221 is increased by $V_{REF}/2^M$ for each clock cycle of a clock signal.

Referring to FIG. 16, $2^M$ resistors 1611 are serially coupled between a ground voltage (GND) terminal and a second reference voltage ($V_{REF}$) terminal. The ramp signal RAMP is generated by selectively outputting a voltage using a multiplexer 1612 at each clock cycle of the clock signal. The ramp signal generator 221 generates the ramp signal RAMP, a reference voltage $V_{REF}$ is provided to the SAR analog-digital analog converting circuit 210, and different offset voltages $V_{OFFSET\_REF}$, $V_{OFFSET\_RAMP}$ and $V_{OFFSET\_GND}$ are preset and provided to buffers 1613 to 1615, respectively. An error occurs between the ramp signal RAMP and the reference voltage $V_{REF}$ used in the SAR analog-digital converting circuit 210 as expressed by Equation 2 due to each offset voltage.

$$V_{STEP}=V_{REF}/2^M+\text{ERROR} \quad \text{[Equation 2]}$$

However, since the ramp signal RAMP is provided to the sampling capacitor C of the capacitor digital-analog converting unit 211 during the remaining voltage resolution operation, the output voltage $V_{DAC}$ of the capacitor digital-analog converting unit 211 is decreased by $2^N$ times due to a charge re-distribution (referring to Equation 3). Since the error between the ramp signal RAMP and the reference voltage $V_{REF}$ is decreased by $2^N$ times, the SAR and SS analog-digital converting device can use a ramp signal generator having the relative low degree of accuracy. During the operation of the SS analog-digital converting circuit 220, the output voltage $V_{DAC}$ of the capacitor digital-analog converting unit 221 is expressed by Equation 3.

$$V_{DAC}=\text{remaining voltage}+K\cdot(V_{STEP})/2^N=\text{remaining voltage}+K\cdot(V_{REF}/2^M+\text{ERROR})/2^N \quad \text{[Equation 3]}$$

Figure 17:
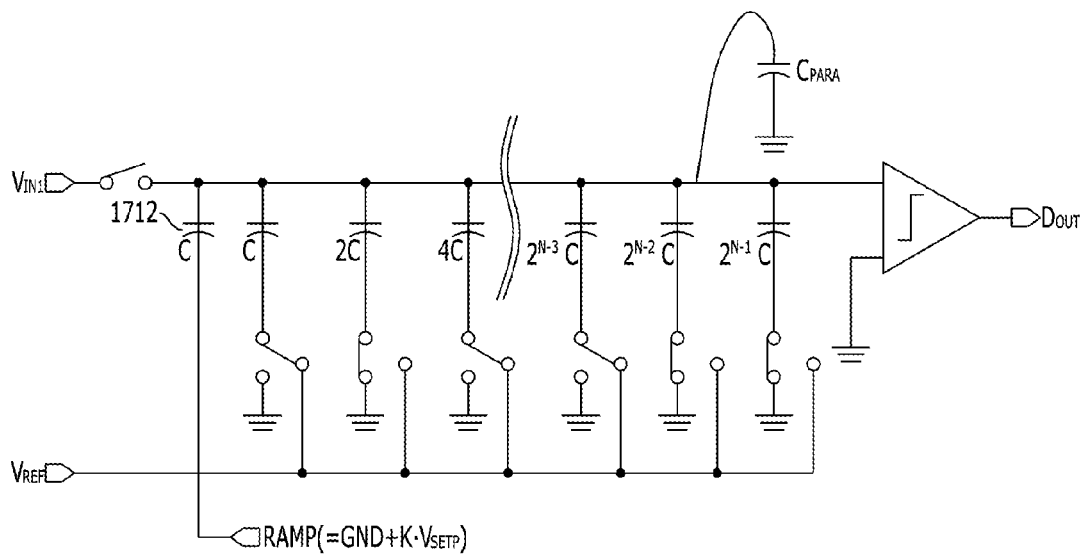
FIG. 17 is a diagram illustrating an SAR and SS analog-digital converting device having a parasitic capacitor at an output terminal of a capacitor digital-analog converting unit in accordance with an embodiment of the present invention.

FIG. 17 is a diagram illustrating an SAR and SS analog-digital converting device having a parasitic capacitor, which is disposed at an output terminal of a capacitor digital-analog converting unit, in accordance with an embodiment of the present invention.

Referring to FIG. 17, if a parasitic capacitor $C_{PARA}$ is coupled to an output terminal of the capacitor digital-analog converting unit 211, an error may occur in a range of the remaining voltage, as expressed by Equation 4 as an output gain of the capacitor digital-analog converting unit 211 changes due to the parasitic capacitor $C_{PARA}$.

$$V_{REF}-V_{REF}\cdot[C/(2^N\cdot C+C_{PARA})]<\text{remaining voltage}<V_{REF} \quad \text{[Equation 4]}$$

Thus, while the SS analog-digital converting circuit 220 resolves the lower M-bits, a ramp signal changes by $V_{REF}\cdot[C/(2^N\cdot C+C_{PARA})]\cdot\frac{1}{2}^M$ to prevent a linearity error of the SAR and SS analog-digital converting device.

An SAR and SS analog-digital converting device in accordance with an embodiment of the present invention provides an output signal (ramp signal) of the ramp signal generator 221 to a sampling capacitor 1712 of the capacitor digital-analog converting unit 211. During an operation of the SS analog-digital converting circuit 220, the ramp signal changes, through an additional charge re-distribution caused by the parasitic capacitor $C_{PARA}$, by $V_{REF}\cdot[C/(2^N\cdot C+C_{PARA})]\cdot\frac{1}{2}^M$ in order to prevent a linearity error of the SAR and SS analog-digital converting device at the output terminal of the capacitor digital-analog converting unit 211.

Thus, an SAR and SS analog-digital converting device in accordance with an embodiment of the present invention can use require a ramp signal generator having the relatively low degree of accuracy, and has a high linearity due to the insensitivity of the SAR and SS analog-digital converting device to an influence of the parasitic capacitor at the output terminal of the capacitor digital-analog converting unit.

Figure 18:
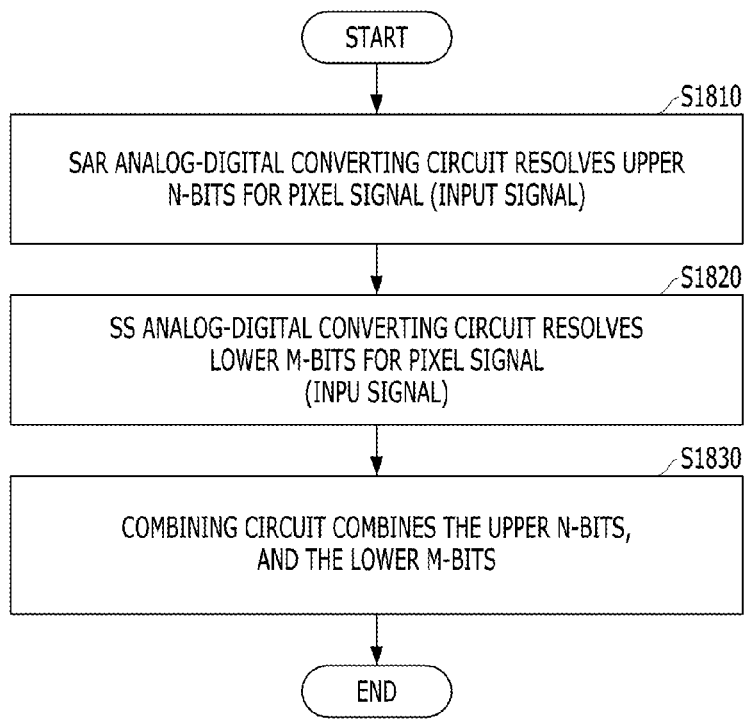
FIG. 18 is a flowchart illustrating an operation method of an SAR and SS analog-digital converting device in accordance with an embodiment of the present invention.

FIG. 18 is a flowchart illustrating an operation of an SAR and SS analog-digital converting device in accordance with an embodiment of the present invention. For convenience of explanation, the operation of FIG. 18 will be described with reference to FIG. 3. However, embodiments should not be construed as being limited thereto.

The SAR analog-digital converting circuit 210 resolves upper N-bits for an input pixel signal $V_{IN}$ at step S1810.

The SS analog-digital converting circuit 220 resolves lower M-bits for the input pixel signal $V_{IN}$, corresponding to a remaining voltage after the SAR analog-digital converting circuit 210 resolves the upper N-bits at step S1820.

The combining circuit 230 combines the upper N-bits, which are resolved by the SAR analog-digital converting circuit 210, and the lower M-bits, which are resolved by the SS analog-digital converting circuit 220, at step S1830 to output an output pixel signal having (N+M) bits.

Figure 19:
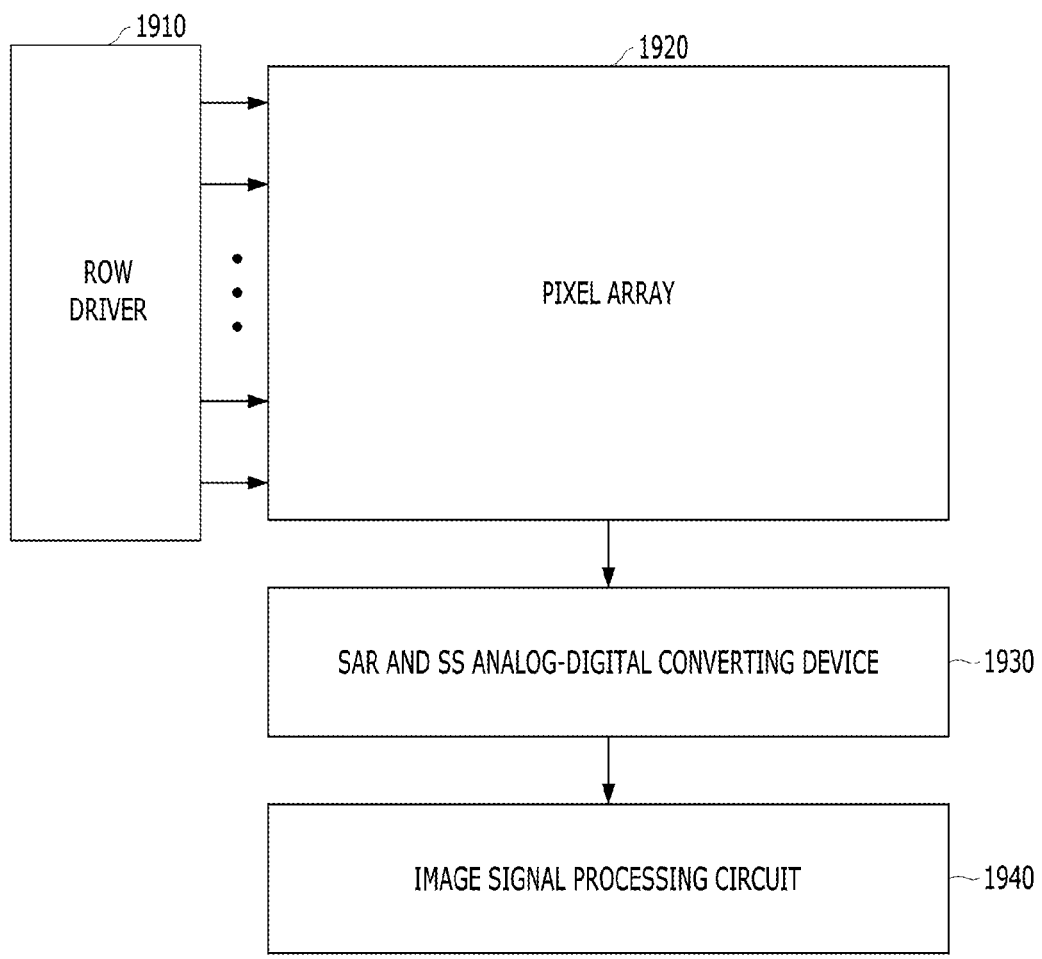
FIG. 19 is a block diagram illustrating a CMOS image sensor including an SAR and SS analog-digital converting device in accordance with an embodiment of the present invention.

FIG. 19 is a block diagram illustrating a CMOS image sensor using an SAR and SS analog-digital converting device in accordance with an embodiment of the present invention.

Referring to FIG. 19, the CMOS image sensor in accordance with an embodiment of the present invention may include a row driver 1910, a pixel array 1920, an SAR and SS analog-digital converting device 1930 and an image signal processing circuit 1940.

The row driver 1910 drives a pixel, which is selected by a row decoder (not shown), of pixels included in the pixel array 1920.

The pixel array 1920 senses light of the pixel using an optic element, and generates a pixel signal corresponding to the sensed light. The pixel, which is selected by the row decoder (not shown), outputs the pixel signal. The pixel signal is an analog pixel signal and includes a reset voltage and a signal voltage.

The SAR and SS analog-digital converting device 1930 receives the analog pixel signal generated by the pixel array 1920 and converts the analog pixel signal into a digital pixel signal. The SAR and SS analog-digital converting device 1930 resolves upper N-bits for the pixel signal $V_{IN}$ using an SAR analog-digital converting circuit, and resolves lower M-bits for the pixel signal $V_{IN}$ using an SS analog-digital converting circuit. After that, the SAR and SS analog-digital converting device 1930 combines the upper N-bits, which are resolved by the SAR analog-digital converting circuit, and the lower M-bits, which are resolved by the SS analog-digital converting circuit. In an embodiment, the SAR and SS analog-digital converting device 1930 has substantially the same configuration as the SAR and SS analog-digital converting device shown in FIGS. 2 and 3.

The image signal processing circuit 1940 receives the digital pixel signal from the SAR and SS analog-digital converting device 1930 and processes the digital pixel signal, i.e., an image signal. Herein, since methods of processing the image signal are widely published and well known, detailed descriptions thereof will be omitted.

Meanwhile, an SAR and SS analog-digital converting device in accordance with an embodiment of the present invention resolves the upper N-bits for the pixel signal $V_{IN}$ using the SAR analog-digital converting circuit, resolves the lower M-bits for the pixel signal $V_{IN}$, which are not resolved by the SAR analog-digital converting circuit, using the SS analog-digital converting circuit, and combines the upper N-bits and the lower M-bits to output the digital pixel signal. However, in another embodiment of the present invention, an SAR and SS analog-digital converting method may resolve the upper N-bits for the pixel signal $V_{IN}$ using the SS analog-digital converting circuit, resolve the lower M-bits for the pixel signal $V_{IN}$, which are not resolved by the SS analog-digital converting circuit, using the SAR analog-digital converting circuit, and combine the upper N-bits, which are resolved by the SS analog-digital converting circuit, and the lower M-bits, which are resolved by the SAR analog-digital converting circuit. This embodiment of the present invention will be more specifically described with reference to FIG. 20.

Figure 20:
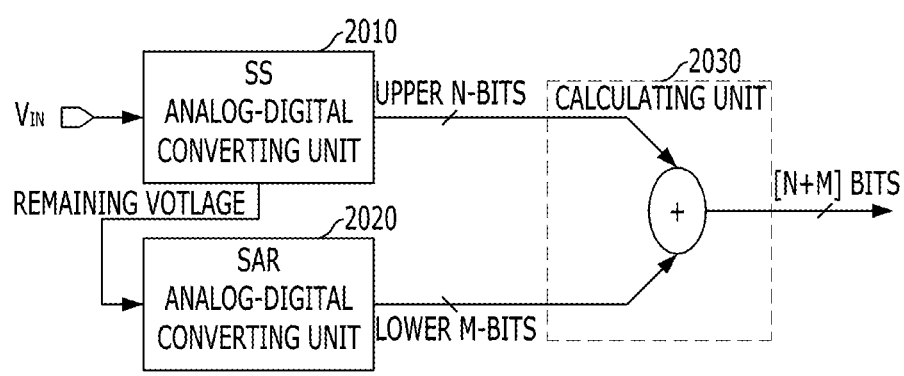
FIG. 20 is a block diagram illustrating an SAR and SS analog-digital converting device in accordance with another embodiment of the present invention.

FIG. 20 is a block diagram illustrating an SAR and SS analog-digital converting device in accordance with another embodiment of the present invention.

Referring to FIG. 20, an SAR and SS analog-digital converting device in accordance with another embodiment of the present invention includes an SS analog-digital converting circuit 2010, an SAR analog-digital converting circuit 2020 and a combining circuit 2030.

The SS analog-digital converting circuit 2010 resolves upper N-bits for a pixel signal $V_{IN}$. The SAR analog-digital converting circuit 2020 resolves lower M-bits for the pixel signal $V_{IN}$, which are not resolved by the SS analog digital converting circuit 2010. The combining circuit 2030 combines the upper N-bits, which are resolved by the SS analog-digital converting unit 2010, and the lower M-bits, which are resolved by the SAR analog-digital converting unit 2020, to output a digital pixel signal corresponding to the pixel signal $V_{IN}$.

More specifically, in order to obtain the analog-digital resolution result having (N+M) bits, as shown in FIG. 20, the SS analog-digital converting circuit 2010 performs a sampling operation on the pixel signal $V_{IN}$ and resolves the upper N-bits. The SAR analog-digital converting circuit 2020 resolves the lower M-bits using the remaining voltage after the SS analog-digital converting circuit 2010 resolves the upper N-bits.

Figure 21:
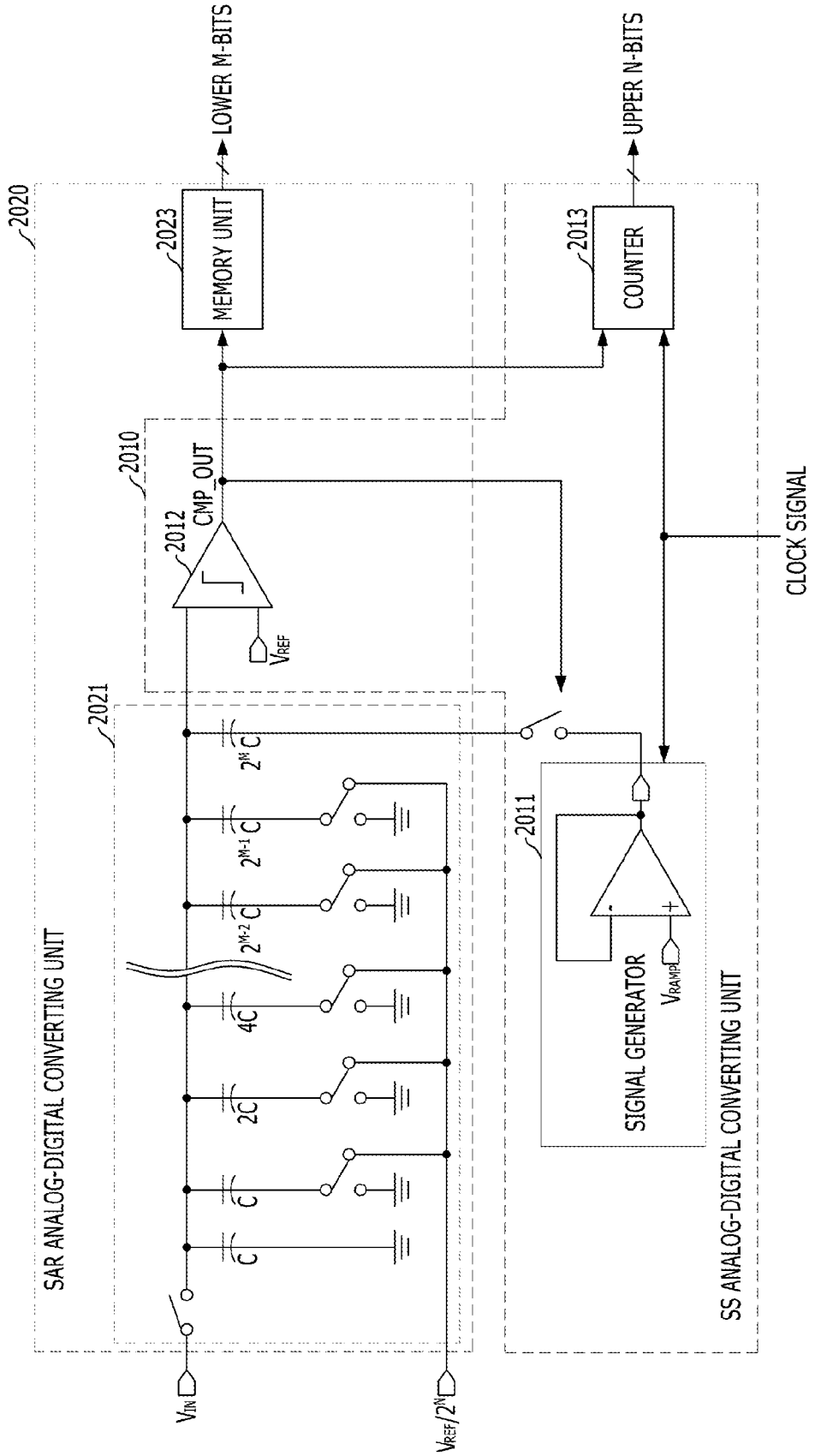
FIG. 21 illustrates an SAR analog-digital converting circuit and an SS analog-digital converting circuit in accordance with another embodiment of the present invention.

FIG. 21 illustrates an SAR analog-digital converting circuit and an SS analog-digital converting circuit in accordance with another embodiment of the present invention.

Referring to FIG. 21, the SS analog-digital converting circuit 2010 may include a ramp signal generator 2011, a comparator 2012 and a counter 2013 outputting upper N-bits. The SAR analog-digital converting circuit 2020 may include a capacitor digital-analog converting unit 2021 including (M+1) capacitors, the comparator 2012 and a memory unit 2023 including an M-bit storage. An output of the ramp signal generator 2011 is provided to an uppermost capacitor $2^M C$ of the capacitor digital-analog converting unit 2021 of the SAR analog-digital converting circuit 2020, and the SAR analog-digital converting circuit 2020 and the SS analog-digital converting circuit 2010 share the comparator 2012. The output of the ramp signal generator 2011 has a step-wave form that includes a plurality of steps, the number of steps corresponding to $2^N$.

When the SAR and SS analog-digital converting device performs a sampling operation on a pixel signal $V_{IN}$ inputted thereto, a voltage of $V_{REF}/2^N$ is provided to a lower terminal of each capacitor in the capacitor digital-analog converting unit 2021. The ramp signal generator 2011 generates a ramp signal in a range from a ground voltage GND to $2 \cdot V_{REF}$ during an operation of the SS analog-digital converting circuit 2010. An output of the capacitor digital-analog converting unit 2021 may have a voltage level from $V_{IN}$ to $V_{IN}+V_{REF}$ by a charge re-distribution. If the output of the capacitor digital-analog converting unit 2021, which is sensed by the comparator 2012, is higher than the second reference voltage $V_{REF}$, the remaining voltage, which is not resolved by the SS analog-digital converting circuit 2010, is stored in the capacitor digital-analog converting unit 2021 by cutting off a switch coupled to the ramp signal generator 2011. The remaining voltage has a range from $V_{REF}$ to $V_{REF}+V_{REF}/2^N$. Then, during an operation of the SAR analog-digital converting circuit 2020, lower M-bits for the pixel signal $V_{IN}$ may be resolved by sequentially providing the ground voltage GND or $V_{REF}/2^N$ to from the uppermost capacitor to the lowermost capacitor of the capacitor digital-analog converting unit 2021.

While embodiments of the present invention have been described, it will be apparent to those skilled in the art that various changes and modifications may be made without departing from the spirit and scope of the invention as defined in the following claims.

What is claimed is:

1. An analog-digital converting device, comprising:
  a successive approximation register (SAR) analog-digital converting circuit suitable for resolving upper N-bits for an input signal using a predetermined SAR logic;
  a single-slope (SS) analog-digital converting circuit suitable for resolving lower M-bits for the input signal using a predetermined SS logic that is different from the predetermined SAR logic; and
  a combining circuit suitable for combining the upper N-bits and the lower M-bits to provide an output signal having (N+M) bits, M and N being positive integers,
  wherein the SAR analog-digital converting circuit using the predetermined SAR logic is different from the SS analog-digital converting circuit using the predetermined SS logic.

2. The analog-digital converting device of claim 1, wherein the SS analog-digital converting circuit resolves the lower M-bits using a remaining voltage of the input signal after the SAR analog-digital converting circuit resolves the upper N-bits.

3. The analog-digital converting device of claim 1, wherein the SAR analog-digital converting circuit comprises:
  a capacitor digital-analog converting unit suitable for selecting one of a first reference voltage and a second reference voltage based on a comparison result of a comparator;
  the comparator suitable for comparing an output voltage of the capacitor digital-analog converting unit with the second reference voltage; and
  a memory unit suitable for storing the comparison result of the comparator.

4. The analog-digital converting device of claim 3, wherein the capacitor digital-analog converting unit outputs a remaining voltage of the input signal after the SAR analog-digital converting circuit completes a resolution operation to provide the upper N-bits.

5. The analog-digital converting device of claim 1, wherein the SS analog-digital converting circuit comprises:
  a ramp signal generator suitable for generating a ramp signal, which is synchronized with a clock signal;
  a capacitor digital-analog converting unit suitable for outputting a voltage changing from a remaining voltage of the input signal after the SAR analog-digital converting circuit resolves the upper N-bits, based on the ramp signal;
  a comparator suitable for comparing an output voltage of the capacitor digital-analog converting unit with the second reference voltage; and
  a counter suitable for counting the number of clock cycles of the clock signal until a logic value of a comparison result of the comparator is changed.

6. The analog-digital converting device of claim 5, wherein an output terminal of the ramp signal generator is coupled to a sampling capacitor of a capacitor digital-analog converting unit of the SAR analog-digital converting circuit.

7. The analog-digital converting device of claim 6, wherein the ramp signal generator provides the ramp signal, which has a plurality of steps and a step size of (second reference voltage−first reference voltage)/$2^M$, to the sampling capacitor.

8. The analog-digital converting device of claim 1, wherein the SAR analog-digital converting circuit shares a capacitor digital-analog converting unit and a comparator with the SS analog-digital converting circuit.

9. An analog-digital converting method, comprising:
  resolving upper N-bits for an input signal using a successive approximation register (SAR) analog-digital converting circuit having a predetermined SAR logic;
  resolving lower M-bits for the input signal using a single-slope (SS) analog-digital converting circuit having a predetermined SS logic that is different from the predetermined SAR logic; and
  combining the upper N-bits and the lower M-bits to provide an output signal having (N+M) bits, wherein the SAR analog-digital converting circuit having the predetermined SAR logic is different from the SS analog-digital converting circuit having the predetermined SS logic.

10. The analog-digital converting method of claim 9, wherein the resolving of the lower M-bits includes resolving the lower M-bits using a remaining voltage of the input signal after the SAR analog-digital converting circuit resolves the upper N-bits.

11. The analog-digital converting method of claim 9, wherein the resolving of the lower M-bits includes providing a ramp signal generated from a ramp signal generator to a sampling capacitor of a capacitor digital-analog converting unit of the SAR analog-digital converting circuit.

12. A complementary metal-oxide semiconductor (CMOS) image sensor, comprising:
 a pixel array suitable for generating a pixel signal;
 a successive approximation register (SAR) and single-slope (SS) analog-digital converting device suitable for resolving upper N-bits for the pixel signal using an SAR analog-digital converting circuit having a predetermined SAR logic, resolving lower M-bits for the pixel signal using an SS analog-digital converting circuit having a predetermined SS logic that is different from the predetermined SAR logic, and combining the upper N-bits and the lower M-bits to provide a digital pixel signal having (N+M) bits; and
 an image signal processing circuit suitable for performing image processing on the digital pixel signal output from the SAR and SS analog-digital converting device,
 wherein the SAR analog-digital converting circuit having the predetermined SAR logic is different from the SS analog-digital converting circuit having the predetermined SS logic.

13. The CMOS image sensor of claim 12, wherein the SS analog-digital converting circuit resolves the lower M-bits using a remaining voltage of the pixel signal after the SAR analog-digital converting circuit resolves the upper M-bits.

14. The CMOS image sensor of claim 12, wherein the SAR analog-digital converting circuit comprises:
 a capacitor digital-analog converting unit suitable for selecting one of a first reference voltage and a second reference voltage based on a comparison result of a comparator;
 the comparator suitable for comparing an output voltage of the capacitor digital-analog converting unit with the second reference voltage; and
 a memory unit suitable for storing the comparison result of the comparator.

15. The CMOS image sensor of claim 12, wherein the SS analog-digital converting circuit comprises:
 a ramp signal generator suitable for generating a ramp signal, which is synchronized with a clock signal;
 a capacitor digital-analog converting unit suitable for outputting a voltage changing from a remaining voltage of the pixel signal after the SAR analog-digital converting circuit resolves the upper N-bits, based on the ramp signal;
 a comparator suitable for comparing an output voltage of the capacitor digital-analog converting unit with a second reference voltage; and a counter suitable for counting the number of clock cycles of the clock signal until a logic value of a comparison result of the comparator is changed.

16. The CMOS image sensor of claim 15, wherein an output terminal of the ramp signal generator is coupled to a sampling capacitor of a capacitor digital-analog converting unit of the SAR analog-digital converting circuit.

17. An analog-digital converting device, comprising:
 a single-slope (SS) analog-digital converting circuit suitable for resolving upper N-bits for an input signal using a predetermined SS logic;
 a successive approximation register (SAR) analog-digital converting circuit suitable for resolving lower M-bits for the input signal using a predetermined SAR logic that is different from the predetermined SS logic; and
 a combining circuit suitable for combining the upper N-bits and the lower M-bits to provide an output signal having (N+M) bits,
 wherein the SAR analog-digital converting circuit using the predetermined SAR logic is different from the SS analog-digital converting circuit using the predetermined SS logic.

18. The analog-digital converting device of 17, wherein the SAR analog-digital converting circuit resolves the lower M-bits using a remaining voltage of the input signal after the SS analog-digital converting circuit resolves the upper N-bits.

19. An analog-digital converting method, comprising:
 resolving upper N-bits for an input signal using a single-slope (SS) analog-digital converting circuit having a predetermined SS logic;
 resolving lower M-bits for the input signal using a successive approximation register (SAR) analog-digital converting circuit having a predetermined SAR logic that is different from the predetermined SS logic; and
 combining the upper N-bits and the lower M-bits to provide an output signal having (N+M) bits,
 wherein the SAR analog-digital converting circuit having the predetermined SAR logic is different from the SS analog-digital converting circuit having the predetermined SS logic.

20. A complementary metal-oxide semiconductor (CMOS) image sensor, comprising:
 a pixel array suitable for generating a pixel signal;
 a single-slope (SS) and successive approximation register (SAR) analog-digital converting device suitable for resolving upper N-bits for the pixel signal using an SS analog-digital converting circuit having a predetermined SS logic, resolving lower M-bits for the pixel signal using an SAR analog-digital converting circuit having a predetermined SAR logic that is different from the predetermined SS logic, and combining the upper N-bits and the lower M-bits to provide a digital pixel signal having (N+M) bits; and
 an image signal processing circuit suitable for performing image processing on the digital pixel signal output from the SS and SAR analog-digital converting device,
 wherein the SAR analog-digital converting circuit having the predetermined SAR logic is different from the SS analog-digital converting circuit having the predetermined SS logic.

* * * * *